United States Patent [19]
Ohshita

[11] Patent Number: 5,920,135
[45] Date of Patent: Jul. 6, 1999

[54] TERMINAL PIN STRUCTURE OF RESOLVER

[75] Inventor: Hiromi Ohshita, Nagano-ken, Japan

[73] Assignee: Tamagawa Seiki Kabushiki Kaisha, Nagano-ken, Japan

[21] Appl. No.: 09/093,039

[22] Filed: Jun. 8, 1998

[30] Foreign Application Priority Data

Sep. 24, 1997 [JP] Japan .................................. 9-258861
Sep. 24, 1997 [JP] Japan .................................. 9-258862
Sep. 24, 1997 [JP] Japan .................................. 9-258863

[51] Int. Cl.⁶ .................................................. H02K 11/00
[52] U.S. Cl. .............................................................. 310/71
[58] Field of Search .................................. 310/71, 254, 45

[56] References Cited

U.S. PATENT DOCUMENTS 4,182,026  1/1980  Searle ........................................ 29/596
4,585,964  4/1986  Hildenbrandt ............................ 310/71
5,243,246  9/1993  Sakamoto ................................ 310/179
5,659,213  8/1997  Imashiro et al. ........................ 310/71

*Primary Examiner*—Nestor Ramirez
*Assistant Examiner*—Joseph Waks
*Attorney, Agent, or Firm*—Sughrue, Mion, Zinn, Macpeak & Seas, PLLC

[57] ABSTRACT

In a terminal pin structure of a resolver, a plastic body (5) which holds terminal pins (4) to which a lead wire (7) is connected is disposed on an undercover (3) disposed to an end of a stator (1) and coils (2) are connected to the projecting portions (4a) of the terminal pins (4) projecting from the plastic body (5). With this arrangement, dispersed soldering of coils to a lead wire which conventionally arises when the coils are directly soldered to the lead wire by a manual operation can be eliminated, a soldering job can be easily carried out, dispersion of quality can be eliminated and workability can be improved.

9 Claims, 15 Drawing Sheets

TERMINAL PIN STRUCTURE OF RESOLVER

BACKGROUND OF THE INVENTION

1. Field of the Invention

The present invention relates to a terminal pin structure of a resolver, and more specifically, to a novel improvement for achieving the improvement of workability and the improvement of reliability by connecting coils disposed to a stator to terminal pins disposed to a lead wire.

2. Description of the Related Art

Although not shown, this type of conventionally used resolvers are such that a lead wire is secured in the slot of a stator and the ends of coils are connected to the lead wire by solder.

Since conventional resolvers are arranged as described above, a connecting job for connecting the lead wire to the coils by solder is difficult, a connected state by solder is dispersed and the improvement of workability and reliability is difficult.

An object of the present invention made to solve the above problem is to provide a terminal pin structure of a resolver capable of achieving the improvement of workability and the improvement of reliability by connecting coils disposed to a stator to terminal pins disposed to a lead wire.

SUMMARY OF THE INVENTION

A terminal pin structure of a resolver according to the present invention having a rotor rotatably disposed to the inside of a ring-shaped stator and coils disposed to the ring-shaped stator and connected to a lead wire is arranged such that a plastic body which holds terminal pins to which the lead wire is connected is disposed on an undercover disposed to an end of the ring-shaped stator and the coils are connected to the projecting portions of the terminal pins projecting from the plastic body. Further, the terminal pins are formed to an L-shape as a whole and the projecting portions of the terminal pins are formed to a cross-shape or a twofold shape by being folded.

DESCRIPTION OF THE PREFERRED EMBODIMENTS

A preferable embodiment of a terminal pin structure of a resolver according to the present invention will be described below with reference to drawings.

Figure 1:
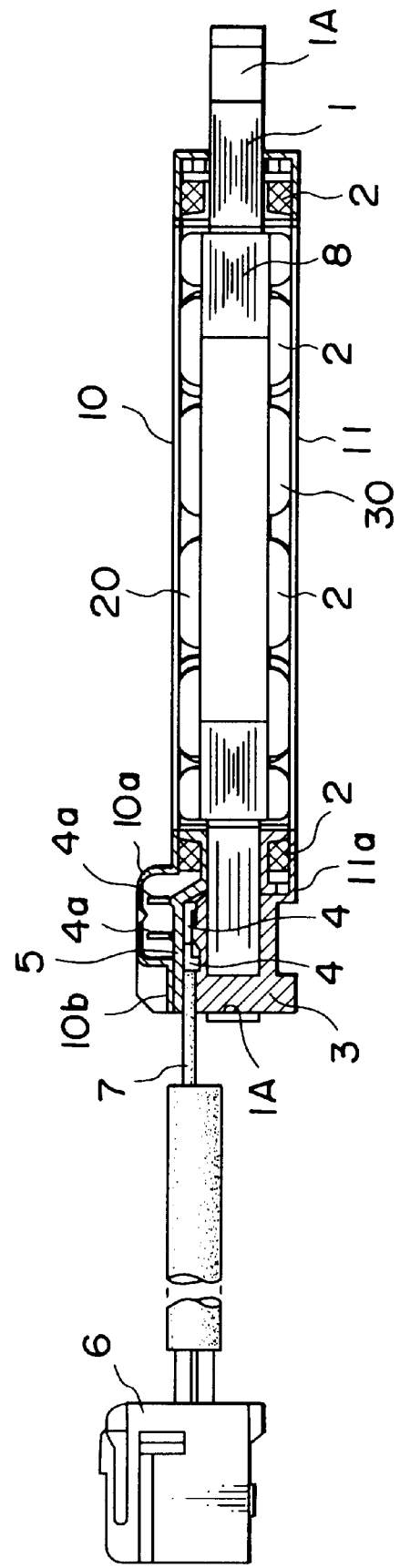
FIG. 1 is a sectional view showing a terminal pin structure of a resolver according to the present invention.
Figure 2:
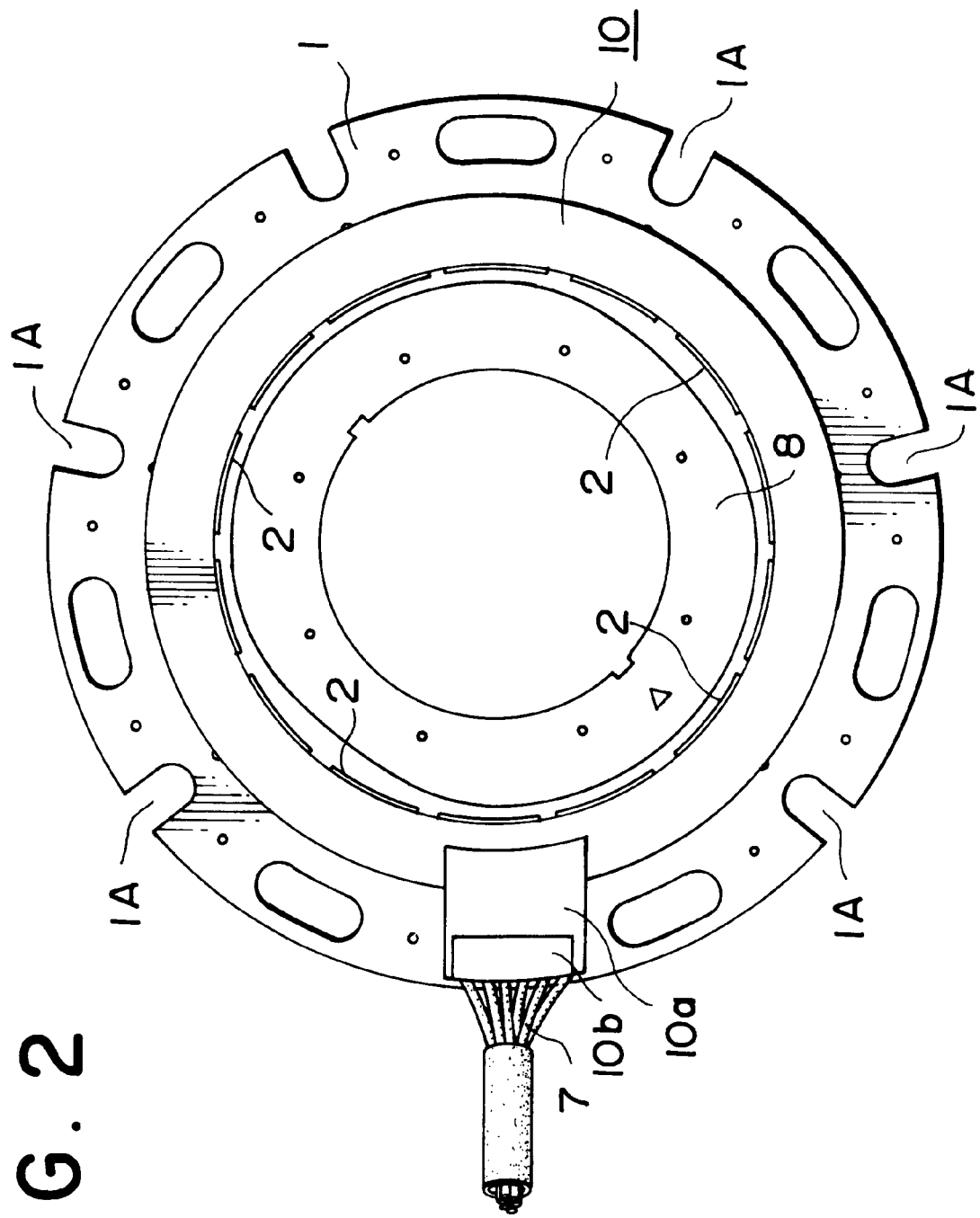
FIG. 2 is a plan view of FIG. 1.
Figure 3:
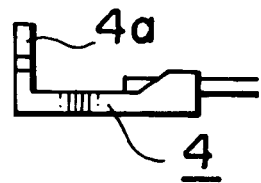
FIG. 3 is view showing an arrangement of a terminal pin of FIG. 1.
Figure 4:
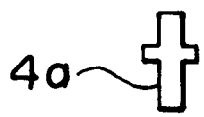
FIG. 4 is a view of an arrangement of a projecting portion of FIG. 3.
Figure 5:
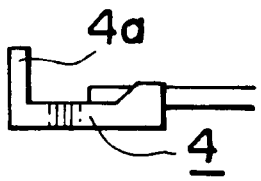
FIG. 5 is a view showing an arrangement of other example of FIG. 3.
Figure 6:
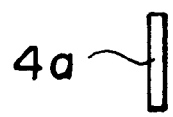
FIG. 6 is a view showing an arrangement of a projecting portion of FIG. 5.
Figure 7:
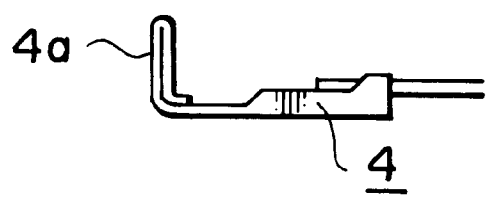
FIG. 7 is a view showing an arrangement of other example of FIG. 3.
Figure 8:
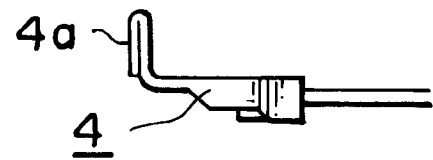
FIG. 8 is a view showing an arrangement of other example of FIG. 3.
Figure 9:
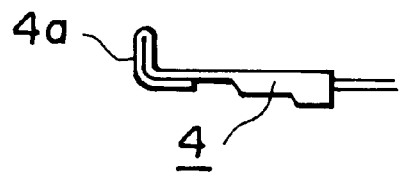
FIG. 9 is a view showing an arrangement of other example of FIG. 3.

What is denoted by numeral 1 in FIG. 1 and FIG. 2 is a ring-shaped stator formed to a ring-shape as a whole and having a multi-layer structure and known coils 2 arranged as, for example, one-phase-excited and two-phase-output type are disposed in a slit (not shown) on the inner edge of the ring-shaped stator 1. That is, insulation cover members 20, 30 formed to a ring shape as a whole are interposed between the coils 2 and the ring-shaped stator 1 in an upward/downward direction and the coils 2 are insulated from the ring-shaped stator 1 by the insulation cover members 20, 30.

An undercover 3 having a C-shaped cross section is disposed to a slot 1A at one location of an end 1a of the ring-shaped stator 1 and a plastic body 5 which holds one or a plurality of terminal pins 4 and is composed of plastic is disposed on the upper surface of the undercover 3. The plastic body 5 is formed integrally with the insulation cover member 20. The projecting portions 4a of the terminal pins 4 pass through the plastic body 5 and project upward and the ends of the coils 2 are connected to the projecting portions 4a.

The respective terminal pins 4 are attached by pressure to a lead wire 7 connected to a connector 6 by pressure attaching means. Although not shown, the undercover 3 is inserted into the slot 1A formed to the outer periphery of the ring-shaped stator 1.

A rotor 8 (formed to a non-perfect-circle shape), which is arranged to a known ring-shaped multi-layer structure (may be an integrally sintered structure in place of the multi-layer structure) as well as of a variable reactance type (VR type) in the embodiment, is rotatably disposed in the ring-shaped stator 1 and first and second ring-shaped coil protection covers 10, 11 are disposed on both the surfaces of the ring-shaped stator 1. The first coil protection cover 10 covers the upper surfaces of the respective coils 2 and the insulation cover member 20 as well as covers the plastic body 5 and the projecting portions 4a. A bulging portion 10a which is formed to a projecting and bulging shape so as to sufficiently cover the projecting portions 4a is formed integrally with the coil protection cover 10 at a position corresponding to the projecting portions 4a.

An end 10b of the first coil protection cover 10 is coupled with the plastic body 5 by melting, an adhesive or the like, whereas the second coil protection cover 11 covers the lower surfaces of the respective coils 2 and the insulation cover member 30 as well as an end 11a thereof is coupled with the undercover 3 by melting, adhering or the like.

The terminal pins 4 are arranged as shown in FIG. 3 to FIG. 9. That is, the projecting portions 4a are formed to a cross-shape in FIG. 3 and FIG. 4, to a rod-shape in FIG. 5 and FIG. 6 and to a twofold shape by being folded in FIG. 7 to FIG. 9. The ends of the coils 2 are electro-mechanically connected to the projecting portions 4a by being wound therearound.

Figure 10:
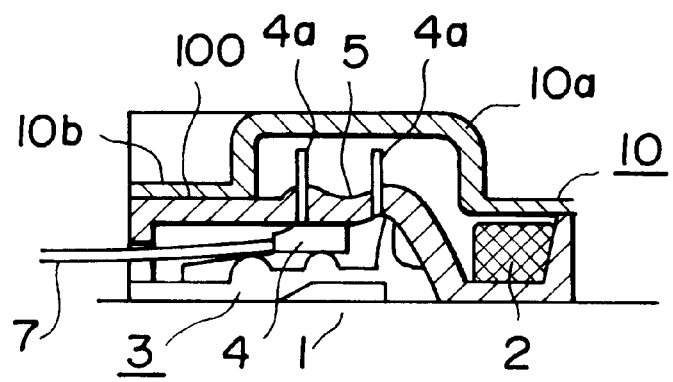
FIG. 10 is an enlarged sectional view of a main portion of FIG. 1.
Figure 11:
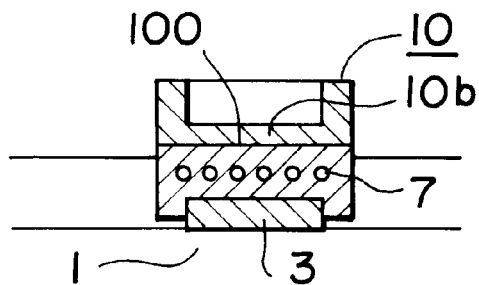
FIG. 11 is a sectional view of FIG. 10.

As shown in FIG. 10 or FIG. 11, an end 10b of the first coil protection cover 10 is coupled with the plastic body 5 by a fusing portion 100, an adhesive or the like, whereas the second coil protection cover 11 covers the lower surfaces of the respective coils 2 as well as an end 11a thereof is coupled with the undercover 3 by fusing, adhering or the like.

Figure 12:
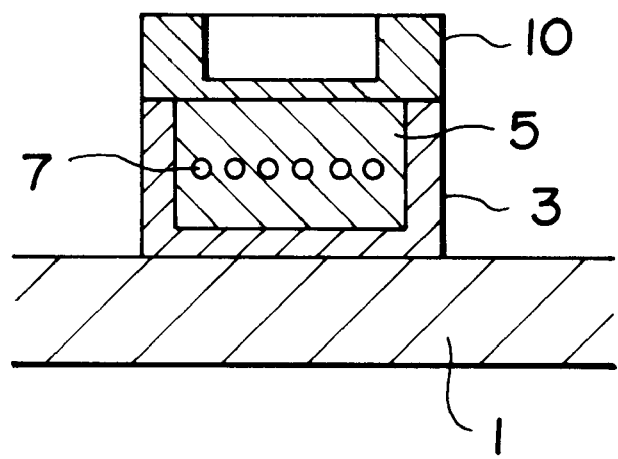
FIG. 12 is a sectional view showing other example of FIG. 11.
Figure 13:
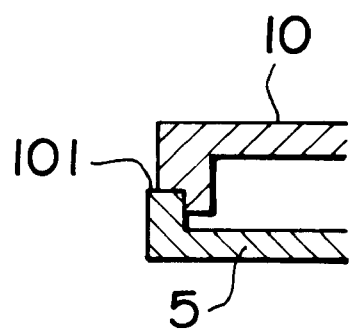
FIG. 13 is a sectional view showing other example of FIG. 12.
Figure 14:
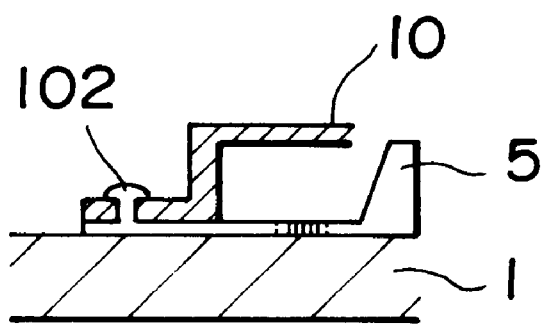
FIG. 14 is a sectional view showing other example of FIG. 13.
Figure 15:
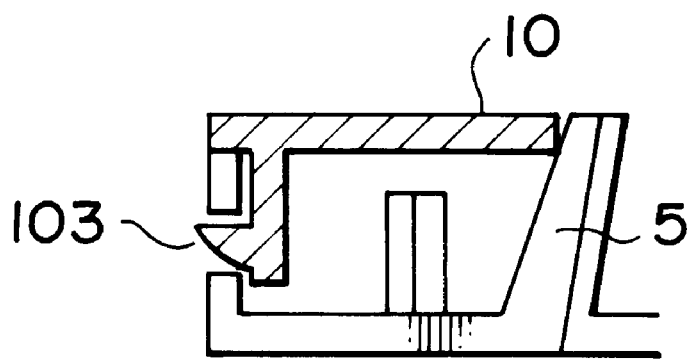
FIG. 15 is a sectional view showing other example of FIG. 14.
Figure 16:
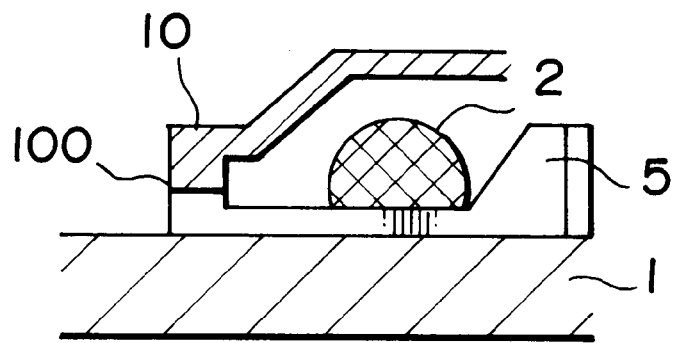
FIG. 16 is a sectional view showing other example of FIG. 15.
Figure 17:
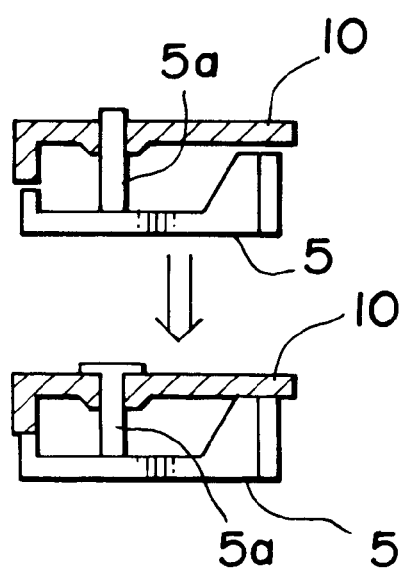
FIG. 17 is a sectional view showing other example of FIG. 16.
Figure 18:
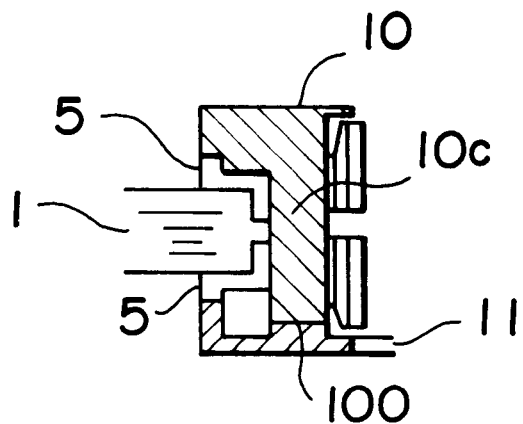
FIG. 18 is a sectional view showing other example of FIG. 17.
Figure 19:
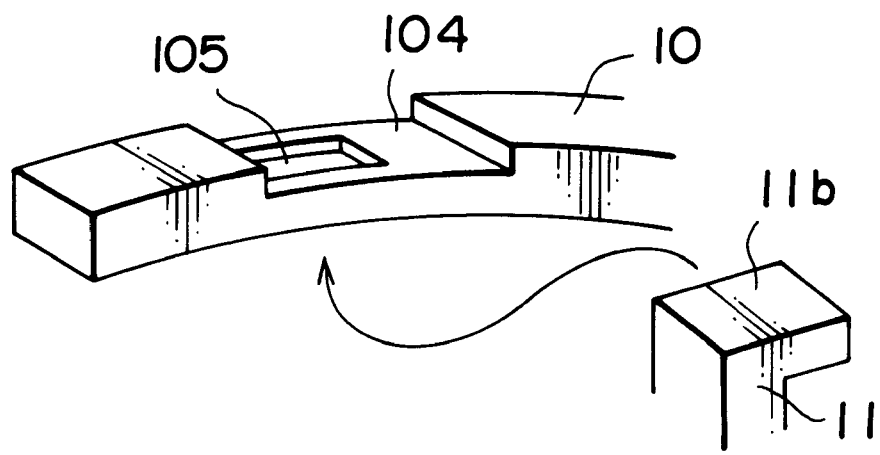
FIG. 19 is a view of a coupling arrangement of each coil protection cover.

The following mounting structure of the coil protection cover 10 may be employed in addition to the aforesaid respective arrangements and a similar working effect can be obtained by the mounting structures. That is, the mounting structure includes, for example, a case that the plastic body 5 is disposed to the inside of the undercover 3 as shown in FIG. 12, a case that the coil protection cover 10 is coupled with the plastic body 5 using a stepped coupling portion 101 as shown in FIG. 13, a case that the coil protection cover 10 is coupled with the plastic body 5 using a caulking portion 102 as shown in FIG. 14, a case that the coil protection cover 10 is coupled with the plastic body 5 using a hook portion 103 as shown in FIG. 15, a case that the coil protection cover 10 of FIG. 10 is partly tapered and coupled using a fusing portion 100 as shown in FIG. 16, a case that the projection 5a of the plastic body 5 is caulked as shown in FIG. 17, a case that a pair of the plastic bodies 5 located on both the surfaces of the stator 1 is clamped between a pair of the coil protection covers 10, 11 and the column 10c of the coil protection cover 10 is coupled by the fusing portion 100 as shown in FIG. 18, and a case that the projection 11b of the second coil protection cover 11 is caused to pass through a hole 105 formed to the recess 104 of the first coil protection cover 10 and coupled.

Figure 20:
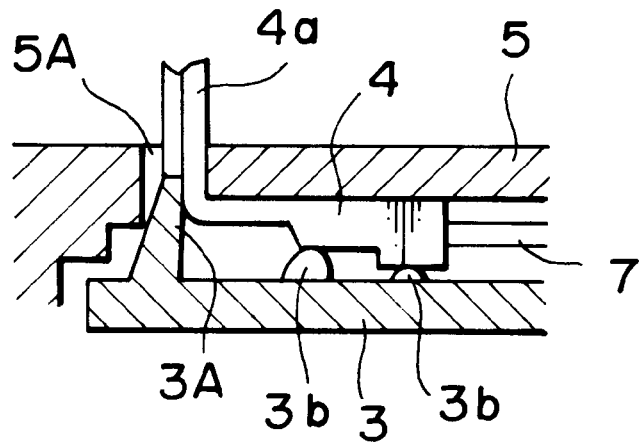
FIG. 20 is a sectional view showing other example of a main portion of FIG. 1.

As shown in FIG. 20, the terminal pins 4 are held by a projection 3A which is formed to an end of the undercover 3 integrally therewith and abutted against the projecting portions 4a of the terminal pins 4. In this case, a plurality of projections 3b formed to the undercover 3 are abutted against the bottom surfaces of the terminal pins 4.

Figure 21:
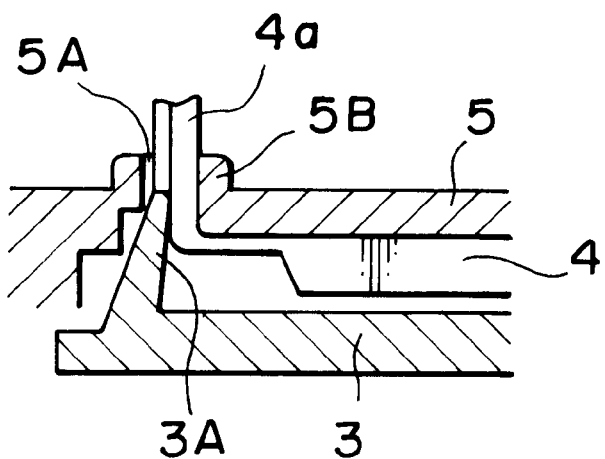
FIG. 21 is a sectional view showing other example of FIG. 20.

Next, as shown in FIG. 21, an overlaid cylindrical portion 5B is formed to the periphery of each of the through holes 5A of the plastic body 5 through which the projecting portions 4a of the plastic body 5 pass so that the projecting portions 4a can be securely held by the cylindrical portions 5B.

Figure 22:
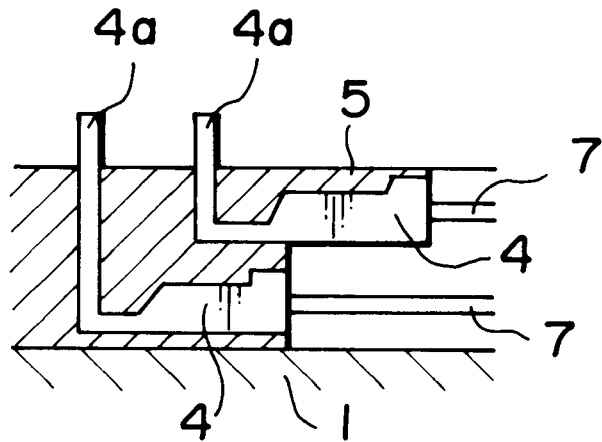
FIG. 22 is a sectional view showing other example of FIG. 20.

In other example shown in FIG. 22, one pair of two-step terminal pins 4 are formed in the plastic body 5 by known insert molding. The number of the terminal pins 4 is not limited to the one pair but any arbitrary number of them may be formed. Although the undercover 3 may be disposed below the plastic body 5 in the above insert molding, it is also possible to omit a portion of the undercover 3 so that the plastic body 5 is in direct contact with a surface of the ring-shaped stator 1.

Figure 23:
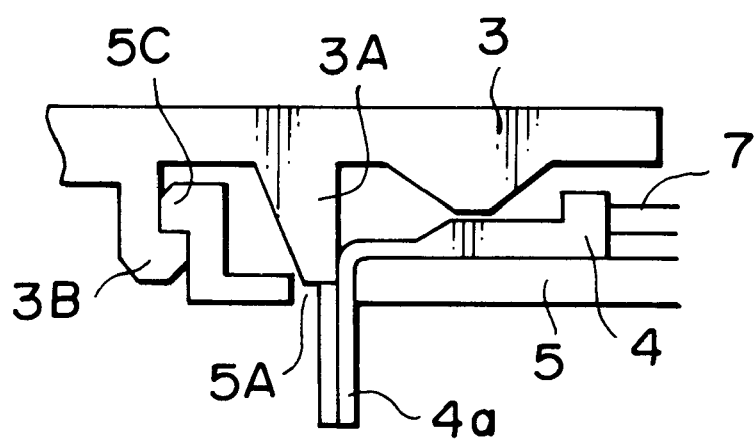
FIG. 23 is a view of an arrangement showing other mounting structure of an undercover.

Next, in other example shown in FIG. 23 in which the aforesaid example is shown by being vertically upset, the engagement of the hook portion 3B of the undercover 3 with the claw portion 5C of the plastic body 5 permits the plastic body 5 to be coupled with the undercover 3 so that the terminal pins 4 are held likewise the above example.

Figure 24:
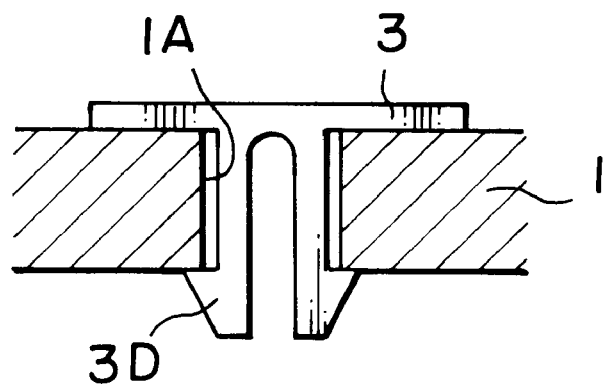
FIG. 24 is a sectional view showing other mounting structure of FIG. 23.
Figure 25:
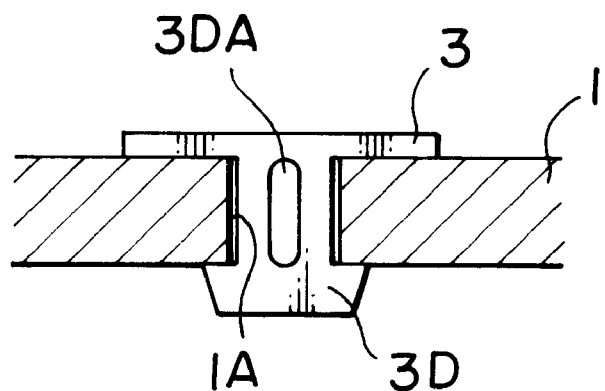
FIG. 25 is a sectional view showing other mounting structure of FIG. 24.

Although the undercover 3 is arranged to have the C-shaped cross section in FIG. 1, it may be coupled with the ring-shaped stator 1 by that the engaging claw 3D formed to the undercover 3 and having elasticity are inserted into the U-shaped groove 1A of the ring-shaped stator 1 and engaged therewith as shown in FIG. 24. Note, they can be coupled with each other by an adhesive without using the coupling claw 3D. The coupling claw 3D is not limited to a fork-shape shown in FIG. 24 and it is also possible to form the coupling claw 3D to an integrally arranged non-modified shape having a hole 3DA as shown in FIG. 25.

Figure 26:
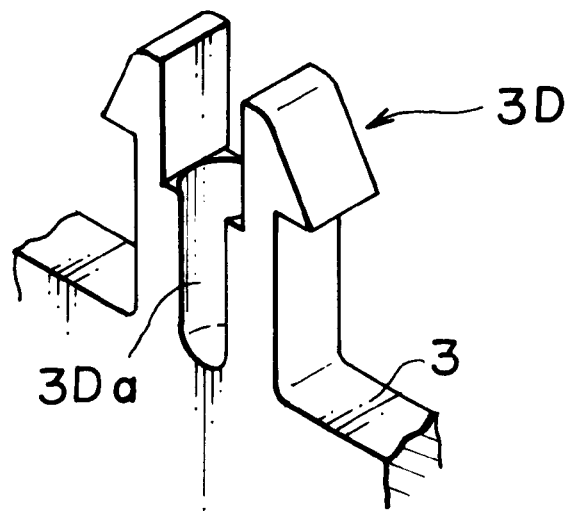
FIG. 26 is a perspective view showing a portion of the undercover.
Figure 27:
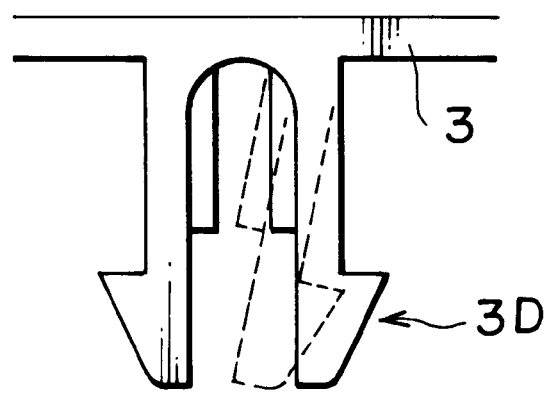
FIG. 27 is a view describing an operation of FIG. 26.
Figure 28:
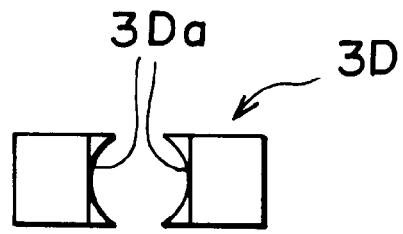
FIG. 28 is a plan view of FIG. 26.
Figure 29:
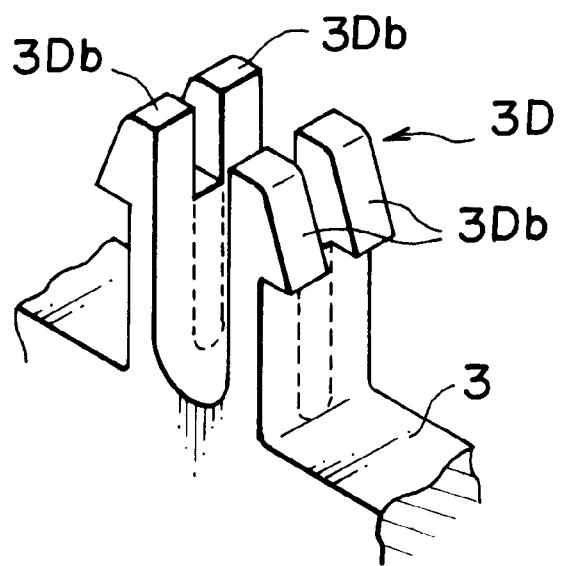
FIG. 29 is a perspective view showing other example of FIG. 26.
Figure 30:
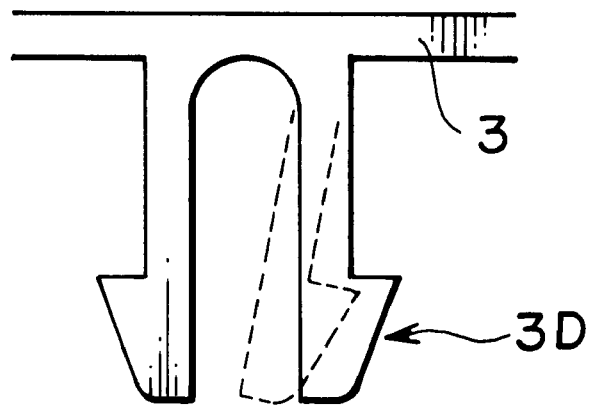
FIG. 30 is a view describing an operation of FIG. 29.
Figure 31:
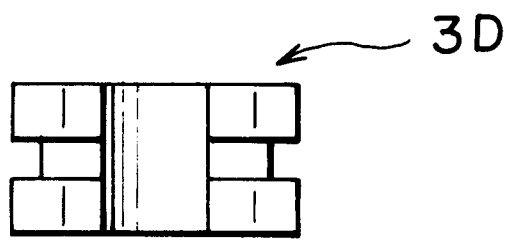
FIG. 31 is a plan view of FIG. 29.

The engaging claw 3D may be formed to a folk-shape with an arc-shaped recess 3Da formed thereto to enhance elasticity and a restoring force as shown in FIG. 26 to FIG. 28, a fork-shape with respective pairs of claws 3Db formed thereto as shown in FIG. 29 to FIG. 31 and further an arrangement in which the portion shown by a dotted line in FIG. 29 is made hollow to enhance an elastic force and a restoring force, in addition to the example shown in FIG. 24.

Since the terminal pin structure of the resolver according to the present invention is arranged as described above, the following advantages can be obtained.

That is, since the plastic body which holds the terminal pins having the lead wire connected thereto is disposed on the undercover mounted to the stator and the coils are directly connected to the terminal pins, a job is stably carried out and productivity is improved as well as reliability is also improved as compared with a conventional method of directly soldering a lead wire to coils.

What is claimed is:

1. A terminal pin structure of a resolver, said resolver having a rotor rotatably disposed to an inside of a ring-shaped stator and coils disposed to the ring-shaped stator and connected to a lead wire, the terminal pin structure consisting of:

a plastic body which is disposed on an undercover disposed to an end of the ring-shaped stator, and terminal pins, held by the plastic body and connected to the lead wire, with projecting portions of the terminal pins, projecting from the plastic body, connected to the coils;

wherein a projection of the undercover is abutted against the terminal pins.

2. A terminal pin structure of a resolver according to claim 1, wherein the terminal pins are formed to an L-shape as a whole.

3. A terminal pin structure of a resolver according to claim 1 or 2, wherein the projecting portions of the terminal pins are formed to a cross-shape.

4. A terminal pin structure of a resolver according to claim 1 or 2, wherein the projecting portions of the terminal pins are formed to a twofold shape by being folded.

5. A terminal pin structure of a resolver according to claim 1, comprising first and second coil protection covers disposed on both surfaces of the ring-shaped stator and formed to a ring shape to cover the coils and a bulging portion formed to the first coil protection cover for covering the projecting portions, wherein the first coil protection cover is coupled with the plastic body.

6. A terminal pin structure of a resolver according to claim 1, wherein the terminal pin structure includes through holes through which the projecting portions of the terminal pins formed to the plastic body pass and cylindrical portions formed to peripheries of the through holes and the cylindrical portions extend along the projecting portions.

7. A terminal pin structure of a resolver according to claim 1, wherein a hook portion formed to the undercover is engaged with a claw portion of the plastic body.

8. A terminal pin structure of a resolver according to claim 1, comprising terminal pins insert molded to the plastic body.

9. A terminal pin structure of a resolver according to claim 1, wherein an engaging claw formed to the undercover and having an elasticity is engaged with a groove of the ring-shaped stator.

* * * * *